US009537585B2

(12) United States Patent
Mayer et al.

(10) Patent No.: US 9,537,585 B2
(45) Date of Patent: Jan. 3, 2017

(54) CIRCUIT, AN INTEGRATED CIRCUIT, A TRANSMITTER, A RECEIVER, A TRANSCEIVER, A METHOD FOR OBTAINING CALIBRATION DATA AND A METHOD FOR GENERATING A LOCAL OSCILLATOR SIGNAL

(71) Applicant: Intel IP Corporation, Santa Clara, CA (US)

(72) Inventors: Thomas Mayer, Linz (AT); Stefan Tertinek, Linz (AT); Peter Preyler, Weyer (AT)

(73) Assignee: Intel IP Corporation, Santa Clara, CA (US)

( * ) Notice: Subject to any disclaimer, the term of this patent is extended or adjusted under 35 U.S.C. 154(b) by 0 days.

(21) Appl. No.: 14/620,488

(22) Filed: Feb. 12, 2015

(65) Prior Publication Data
US 2015/0280842 A1 Oct. 1, 2015

(30) Foreign Application Priority Data
Mar. 31, 2014 (DE) .......................... 10 2014 104 478

(51) Int. Cl.
| H04B 17/21 | (2015.01) |
| H04B 1/62 | (2006.01) |
| H03L 7/197 | (2006.01) |

(52) U.S. Cl.
CPC ............. *H04B 17/21* (2015.01); *H03L 7/1976* (2013.01); *H04B 1/62* (2013.01)

(58) Field of Classification Search
CPC ........... H04L 25/03343; H04L 27/2032; H03C 3/0941; H03C 3/095; H03C 3/0966; H03L 7/1976; H04B 1/62; H04B 17/21

USPC ................................... 375/316, 376
See application file for complete search history.

(56) References Cited

U.S. PATENT DOCUMENTS

| 8,170,171 | B2 * | 5/2012 | Kobayashi ..................... 375/376 |
| 8,693,601 | B2 * | 4/2014 | Adut .................. H03H 17/0275 |
| | | | 370/310 |
| 8,773,182 | B1 * | 7/2014 | Degani et al. ................ 327/156 |
| 8,947,172 | B2 * | 2/2015 | Wang et al. ................... 332/128 |
| 2009/0322439 | A1 * | 12/2009 | Mayer et al. ................. 332/118 |
| 2010/0066421 | A1 * | 3/2010 | Geng et al. ................... 327/159 |

(Continued)

OTHER PUBLICATIONS

English translation of a German Office Action dated Dec. 9, 2014 for copending German application No. 10 2014 104 478.9.

*Primary Examiner* — Freshteh N Aghdam
(74) *Attorney, Agent, or Firm* — Eschweiler & Associates, LLC

(57) ABSTRACT

A circuit according to an example includes a digital-to-time converter and a signal processing circuit coupled to the digital-to-time converter and configured to generate a processed signal derived from a signal provided to the signal processing circuit, the processed signal including a predetermined phase relation with respect to the signal provided to the signal processing circuit, wherein the circuit is configured to receive a reference signal and to generate an output signal based on the received reference signal. The a measurement circuit is configured to measure a delay between the output signal and the reference signal, wherein the output of the digital-to-time converter is coupled to a memory configured to store calibration data of the digital-to-time converter based on the measured delay.

21 Claims, 11 Drawing Sheets

(56) References Cited

U.S. PATENT DOCUMENTS

| | | | |
|---|---|---|---|
| 2012/0074993 A1* | 3/2012 | Chen | H03L 1/00 |
| | | | 327/147 |
| 2012/0212296 A1* | 8/2012 | Chen | H03C 3/0925 |
| | | | 331/25 |
| 2013/0033293 A1* | 2/2013 | Zhang | H03L 7/1976 |
| | | | 327/156 |
| 2013/0211758 A1* | 8/2013 | Prathapan | H03L 7/08 |
| | | | 702/66 |
| 2013/0223564 A1* | 8/2013 | Mayer et al. | 375/296 |

* cited by examiner

US 9,537,585 B2

CIRCUIT, AN INTEGRATED CIRCUIT, A TRANSMITTER, A RECEIVER, A TRANSCEIVER, A METHOD FOR OBTAINING CALIBRATION DATA AND A METHOD FOR GENERATING A LOCAL OSCILLATOR SIGNAL

CROSS REFERENCE TO RELATED APPLICATION

This application claims priority to German Patent Application number 102014104478.9, filed Mar. 31, 2014 with the German Patent Office and is hereby incorporated in its entirety.

FIELD

The present disclosure relates to calibrating a digital-to-time converter (DTC) and, in particular, to an integrated circuit, a transmitter, a receiver, a transceiver, a method for obtaining calibration data, a method for generating an output signal, an apparatus for obtaining calibration data, an apparatus for generating a local oscillator signal, and corresponding software-based implementations.

BACKGROUND

In many transmitter, receiver or transceiver applications, a local oscillator (LO) signal is used, for instance, for up-mixing or down-mixing a signal to be transmitted. Digital-to-time converters (DTC) may, for instance, be used to generate these modulated or unmodulated local oscillator signals. The digital-to-time converters may be used as delay circuits to control, for instance, the phase of the corresponding oscillating signals. Depending on the application, for instance, depending on the modulation scheme used, the requirements concerning the linearity of the digital-to-time converter may be crucial. Since a digital-to-time converter operates directly on a phase-sensitive signal, filtering the DTC output signal may not be a viable step, which may even further increase a need to linearize the digital-to-time converter.

One way to lower the linearity requirement on such a circuit is the concept of pre-distortion, which may be applied to a control signal input of the digital-to-time converter. In this case, measured non-linearity values may be used to counteract the non-linearity of the digital-to-time converter. However, this may require an exact calibration of the digital-to-time converter to a very high degree.

Also in other technical fields, digital-to-time converters may be used, for instance as delaying circuits, but also for other purposes. For instance, digital-to-time converters may be used in measurement applications, synchronization applications and other applications to name just a few. Also in these applications the linearity of the digital-to-time converter may directly influence the application.

Also in these fields a technique similar to the previously-mentioned pre-distortion technique may be used to counter-act at least partially of the digital-to-time converters. Also for these applications calibration data for the digital-to-time converters may be useful to increase the accuracy of the results achieved.

SUMMARY

Therefore, a demand exists to provide an easily applicable architecture for obtaining calibration data of a digital-to-time converter.

This demand may be satisfied by a circuit, an integrated circuit, a transmitter, a receiver, a transceiver, a method for obtaining calibration data, a method for generating a local oscillator signal, an apparatus for obtaining calibration data, an apparatus for generating a local oscillator signal and a computer program according to any of the independent claims.

BRIEF DESCRIPTION OF THE DRAWINGS

Some examples of apparatus and/or methods will be described in the following by way of example only, and with reference to the accompanying Figures.

DETAILED DESCRIPTION

Figure 1:
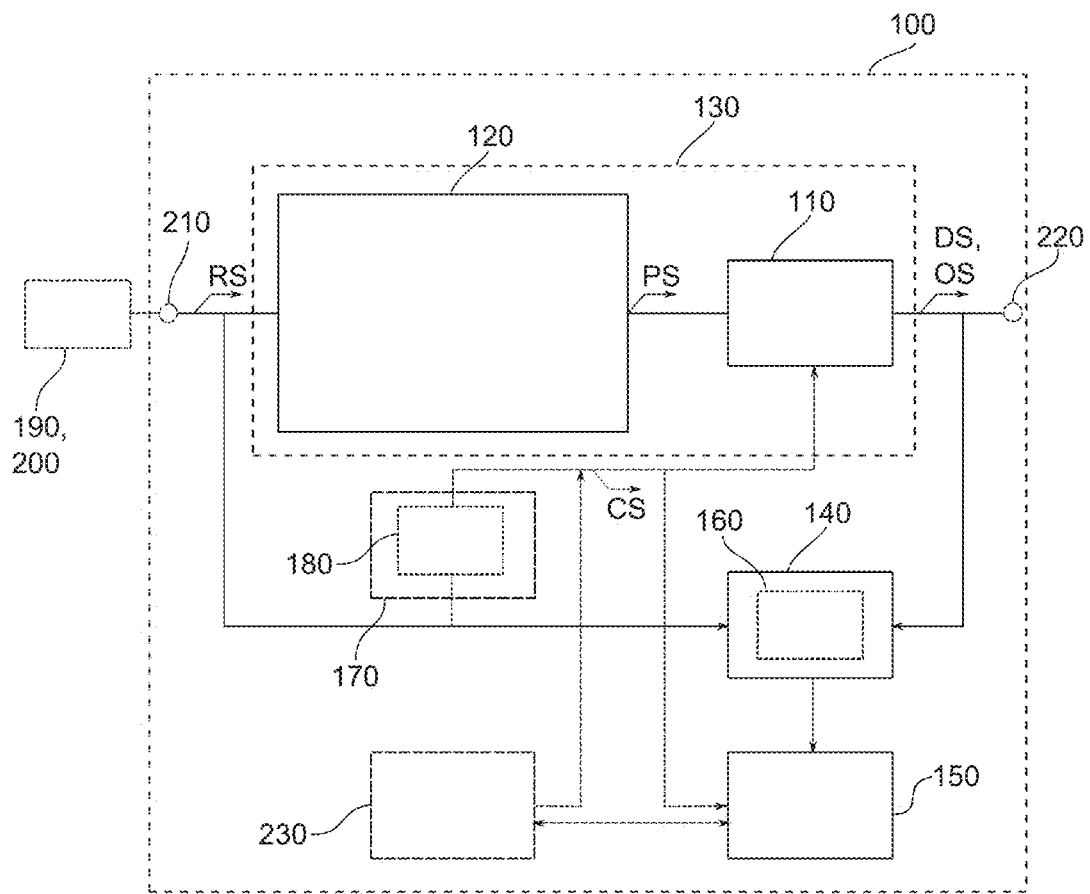
FIG. 1 shows a simplified block diagram of a circuit according to an example.

Various examples will now be described more fully with reference to the accompanying drawings in which some examples are illustrated. In the figures, the thicknesses of lines, layers and/or regions may be exaggerated for clarity.

Accordingly, while examples are capable of various modifications and alternative forms, the illustrative examples in the figures and will herein be described in detail. It should be understood, however, that there is no intent to limit examples to the particular forms disclosed, but on the contrary, examples are to cover all modifications, equivalents, and alternatives falling within the scope of the disclosure. Like numbers refer to like or similar elements throughout the description of the figures. Moreover, summarizing reference signs will be used to refer to more than one structure, element or object or to describe more than one structure, element or object at the same time. Objects, structures and elements referred to by the same, a similar or a summarizing reference sign may be identically implemented. However, one, some or all properties, features and dimensions may also vary from element to element.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which examples belong. It will be further understood that terms, e.g., those defined in commonly used dictionaries, should be interpreted as having a meaning that is consistent with their meaning in the context of the relevant art and will not be interpreted in an idealized or overly formal sense unless expressly so defined herein.

As indicated above, digital-to-time converters (DTC) may be used in a wide range of technical applications, for instance, to generate a modulated or an unmodulated local oscillator (LO) signal. Such a local oscillator signal may, for instance, be used for receiving, transmitting or exchanging data to name just a few examples. For instance, the data may be transmitted, received or exchanged using wireless techniques as well as wire-bound techniques. Examples come, as a consequence, for instance from the technical fields of receivers, transmitters and transceivers. These devices may, for instance, operate in the field of radio frequencies (RF).

A general demand exists to provide one or more modulated or unmodulated local oscillator signals for, for instance, RF transceivers out of a single phase-locked-loop (PLL) circuit. Moreover, a demand exists to integrate more and more functions, blocks, modules and other structures into a single circuit, for instance, an integrated circuit.

In PLL-based systems, a digital-to-time converter may, for instance, be used as a delay circuit to enable the PLL circuit to closely control the phase of the signal provided. For such an application, a crucial requirement of the digital-to-time converter may be its linearity. Since the digital-to-time converter operates directly at the phase signal, filtering of the digital-to-time converter output may not be available, setting an even higher demand and pressure on the linearity of the digital-to-time converter.

To lower the linearity requirement on such a circuit, the technical pre-distortion may be applied to the digital-to-time converter input, using, for instance, measured non-linearity values to counteract the effect of non-linearity. However, this may require an exact calibration of the digital-to-time converter resulting, depending on the application in mind, down to sub-picosecond delay measurements.

FIG. 1 shows a simplified block diagram of a circuit 100 according to an example. Employing a circuit 100 according to an example may enable a more accurate digital-to-time converter (DTC) calibration using, for instance, a narrow-range time-to-digital converter TDC. As will be laid out below in more detail, these calibration techniques may be used in the context of digital-to-time converters, which in turn may be used for polar modulators or to implement other more complex modulation schemes. A circuit 100 may, for instance, be implemented in a high volume architecture comprising, for instance, computer system architecture features at interfaces made in high volumes. It may encompass information architectures, devices such as transistors, and associated manufacturing processes.

The circuit 100 comprises a digital-to-time converter 110 and a signal processing circuit 120. The signal processing circuit 120 is configured to generate a processed signal PS derived from a signal provided to the signal processing circuit 120. The processed signal PS comprises a predetermined phase relation with respect to the signal provided to the signal processing signal 120.

In the example shown in FIG. 1, the signal processing circuit 120 is coupled before the digital-to-time converter 110 along the signal flow as indicated by, for instance, the direction of the processed signal PS. The circuit 100 is configured to receive a reference signal RS and to generate an output signal OS based on the received reference signal RS. Hence, in the example shown in FIG. 1, the signal provided to the signal processing circuit 120 corresponds to the reference signal RS. However, in other examples, the order of the digital-to-time converter 110 and the signal processing circuit 120 may be different as will be laid out, for instance, with respect to FIG. 2.

The digital-to-time converter 110 and the signal processing circuit 120 are coupled in series forming a series connection 130, wherein the reference signal RS is provided to an input of the series connection 130 and the output signal OS is obtainable from an output of the series connection 130. As mentioned before, in the example shown in FIG. 1, the reference signal RS is provided to the signal processing circuit 120, while the output signal OS is obtainable from the digital-to-time converter 110.

The circuit 100 further comprises a measurement circuit 140 which is configured to measure a delay between the output signal OS and the reference signal RS. To enable this, the measurement circuit 140 is coupled to both, an input of the signal processing circuit 120 to receive the reference signal RS and an output of the digital-to-time converter 110 and, therefore, to an output of the circuit 100 to obtain the output signal OS.

The circuit 100 further comprises a memory 150, which is coupled to an output of the digital-to-time converter 110 and which is configured to store calibration data of the digital-to-time converter 110 based on the measured delays by the digital-to-time converter 110. The measurement circuit 140 may be configured to detect more than three different delay values between the output signal OS and the reference signal RS. Hence, the measurement circuit 140 may, for instance, be capable of detecting more values than a comparator. For instance, the measurement circuit may comprise or consist of a time-to-digital converter 160.

In the example depicted in FIG. 1, the signal processing circuit 120 is designed and constructed in such a way that it is operable without a signal provided by the measurement circuit 140. In other words, as shown in FIG. 1, the output of the measurement circuit 140 is not fed back to the signal processing circuit 120. However, in other circuits 100, the measurement circuit 140 may be implemented, for instance, as part of the signal processing circuit 120.

The circuit 100 obtains the calibration data for the digital-to-time converter 110 by comparing or measuring a delay, a phase shift or a phase variation between the reference signal RS and the output signal OS. In order to do this, the signal processing circuit 120 is provided with a reference signal RS, which in turn generates the processed signal PS having, with respect to the reference signal RS, a known or pre-defined phase relation. This known or pre-defined phase relation may, for instance, be caused by internal delays or other effects caused by the signal processing circuit 120. To enable this, the signal processing circuit 120 is capable of processing oscillating signals and to generate, based on the oscillating signal provided to it, the processed signal PS also as an oscillating signal.

Due to the periodicity of the oscillating signal it is possible to counteract the delay caused by the signal processing circuit 120 by further delaying the processed signal PS by the digital-to-time converter 110, which in turn is capable of controllably delaying a signal provided to its input and to generate a delayed signal DS at an output of the digital-to-time converter 110. In the example shown in FIG. 1, the output signal OS corresponds to the delayed signal DS. Naturally, in other examples, the delayed signal DS may correspond to another signal as will be laid out in more detail below.

The measurement circuit 140 is provided with both, the reference signal RS and the output signal OS. By measuring the delay between these signals, for instance, by using a time-to-digital converter 160 as depicted in FIG. 1, the delay of the overall circuit 100 is obtainable and can then be stored as calibration data to the memory 150. For instance, the calibration data may be stored in the form of a look-up-table to name just one example.

During an operation of the circuit 100, when, for instance, the output signal OS can be used as a local oscillator signal (LO signal), the calibration data stored in the memory 150 may be used to pre-distort the setting of the digital-to-time converter 110 to obtain more linearized characteristics of the digital-to-time converter 110. Using a circuit 100 as depicted in FIG. 1 may offer the possibility that an on-the-fly calibration of the digital-to-time converter 110 may be avoidable. By measuring the delay using the measurement circuit 140 being capable of detecting more than three different delay values between the output signal OS and the reference signal RS, a measurement may be used, the results of which may be afterwards used to counteract the facts of non-linearity. Therefore, distortions and other side effects of an on-the-fly calibration may be avoidable.

Moreover, by repeatedly carrying out the measurements and by averaging out the corresponding calibration data, calibrating the circuit 100 or rather its digital-to-time converter 110 may be possible even in a more noise-prone environment.

Moreover, it may be possible to use a measurement circuit 140 with lower requirements concerning linearity. Under ideal circumstances, the phase difference or phase variance between the reference signal RS and the output signal OS is under all operational conditions constant, for instance, equal or essentially equal to zero (0). Since the digital-to-time converter 110 is used to counteract the phase variance imposed by the signal processing circuit 120, even in an uncalibrated state the circuit 100 is likely to show only smaller phase variances and delays. As a consequence, the range of possible delays measured by the measurement circuit 140 may be smaller compared to other calibration procedures. Due to this smaller range of possible delay values, a non-linearity and other measurement errors may be less significant compared to these other calibration procedures, since these nonlinearities and other errors tend to get larger, the larger the delays of phase variations or differences between the output signal OS and the reference signal RS tend to become. In other words, the measurement circuit 140 may provide more accurate data since its measurement range is limited compared to other calibration procedures.

The signal processing circuit 120 may comprise at least partially or even consist of an integer phase-locked-loop circuit (integer PLL circuit), a fractional phase-locked-loop circuit (fractional PLL circuit), a direct digital synthesizer circuit (DDS circuit), a frequency multiplier circuit or any combination thereof. Depending on the implementation of the signal processing circuit 120, it may be able to provide the processed signal having a frequency with respect to a frequency of the signal provided to the signal processing circuit 120 such that this ratio or its inverse is larger than 1 and equal to a sum of an integer part and a non-vanishing fractional part, an absolute value of which may be smaller than 1. Due to this non-vanishing fractional part, which is smaller than 1, a phase shift built up inside the signal processing circuit 120 which is to be compensated by the digital time converter 110. As a consequence, it may be possible to use this property of the signal processing circuit 120 to drive the digital-to-time converter 110 during the calibration process to different phase differences or delays.

For instance, the ratio or the inverse of the ratio mentioned above may be equal to (I+p/q), wherein I is an integer and wherein p and q are non-vanishing integers. To make sure the absolute value of the non-vanishing fractional part is smaller than 1, the absolute value of p is smaller than an absolute value of q.

As outlined, the signal processing circuit 120 may be able to change the predetermined phase relation, for instance, based on the previously-described phase difference building up due to the fractional part of the ratio, the circuit may comprise a generator circuit 170 which is capable of providing a control signal CS to the digital-to-time converter 110 to counteract the change of the predetermined phase relation. Depending on the implementation, the generator circuit 170 may comprise an integrator or an accumulator 180, which is coupled to the digital-to-time converter 110 to provide the control signal to it. The control signal CS may comprise information concerning the previously-mentioned fractional part of the ratio or its inverse. As a consequence, the integrator or accumulator 180 may be configured to process a signal, for instance, from the signal processing circuit 120 comprising information concerning the previously-mentioned fractional part of the ratio or its inverse. The terms "integrator" and "accumulator" may be used synonymously. Both, an accumulator and an integrator may be capable of summing up, integrating or accumulating a signal, values or other information provided to them based on previously received signals, values or information. Hence, both terms may refer to identical implementations or circuits, which may be called differently in different applications, implementations and scenarios.

However, depending on the implementation of the signal processing circuit 120, the integrator or accumulator 180 and other parts of the generator 170 may optionally also be implemented as part of the signal processing circuit 120. For instance, in the case of a fractional phase-locked-loop circuit being at least partially comprised in the signal processing circuit 120, an accumulator of the fractional PLL circuit may be used as the integrator or accumulator 180 of the circuit 100.

The integrator or accumulator 180 may be optionally clocked by the reference signal RS or a signal derived from the reference signal RS comprising essentially the same frequency as the reference signal RS. For instance, the reference signal RS may be provided by a crystal oscillator 190, for instance, a temperature-stabilized crystal oscillator 200. The crystal oscillator 190 or temperature-stabilized crystal oscillator 200 may be coupled to the circuit 100 by an optional terminal 210 to provide the reference signal RS to the circuit 100.

Naturally, the crystal oscillator 190 or the temperature-stabilized crystal oscillator 200 may equally well be implemented as part of the circuit 100. In this case, it may not be necessary to implement a terminal 210 to couple the oscillators 190, 200, to the circuit 100. Naturally, the circuit 100 may also comprise an output terminal 220 coupled to the output of the series connection 130 and, in the example shown in FIG. 1, coupled to an output of the digital-to-time converter 110 at which the output signal OS is obtainable.

Depending on the application in mind, the circuit 100 may be able to generate the output signal OS as a radio frequency signal. In this case, the circuit 100 may, for instance, be used in a wireless or wire-bound radio-frequency-related transmission scheme. Details of such an implementation will be described below.

Returning back to the memory 150, the control signal may be used to address or otherwise specify a memory location inside the memory 150 to which the calibration data concerning the specific phase difference is to be stored. This may be done since the control signal CS comprises information concerning the current phase difference to be compensated by the digital-to-time converter 110. Naturally, also other storing schemes may be implemented. Storing may, for instance, comprise averaging the calibration data over a plurality of measurement cycle. This may be implemented based on an arithmetic mean value calculation, a geometric value calculation, a weighted average calculation or any other mean value or average calculation scheme.

The circuit 100 may be further able to generate a local oscillator signal as the output signal OS during the normal mode of operation. The normal mode of operation may be different from the calibration mode. The circuit 100 may in this case be capable of controlling the digital-to-time converter 110 during the generation of a local oscillator signal based on the calibration data stored in the memory 150. To facilitate this, the circuit 100 may, for instance, further comprise a control circuit 230, which is capable of accessing the memory 150 and capable of providing a corresponding control signal to the digital-to-time converter 110. The control circuit 230 may, for instance, be comprised or implemented as a part of the generator circuit 170 or as a separate circuit as depicted in FIG. 1.

Figure 2:
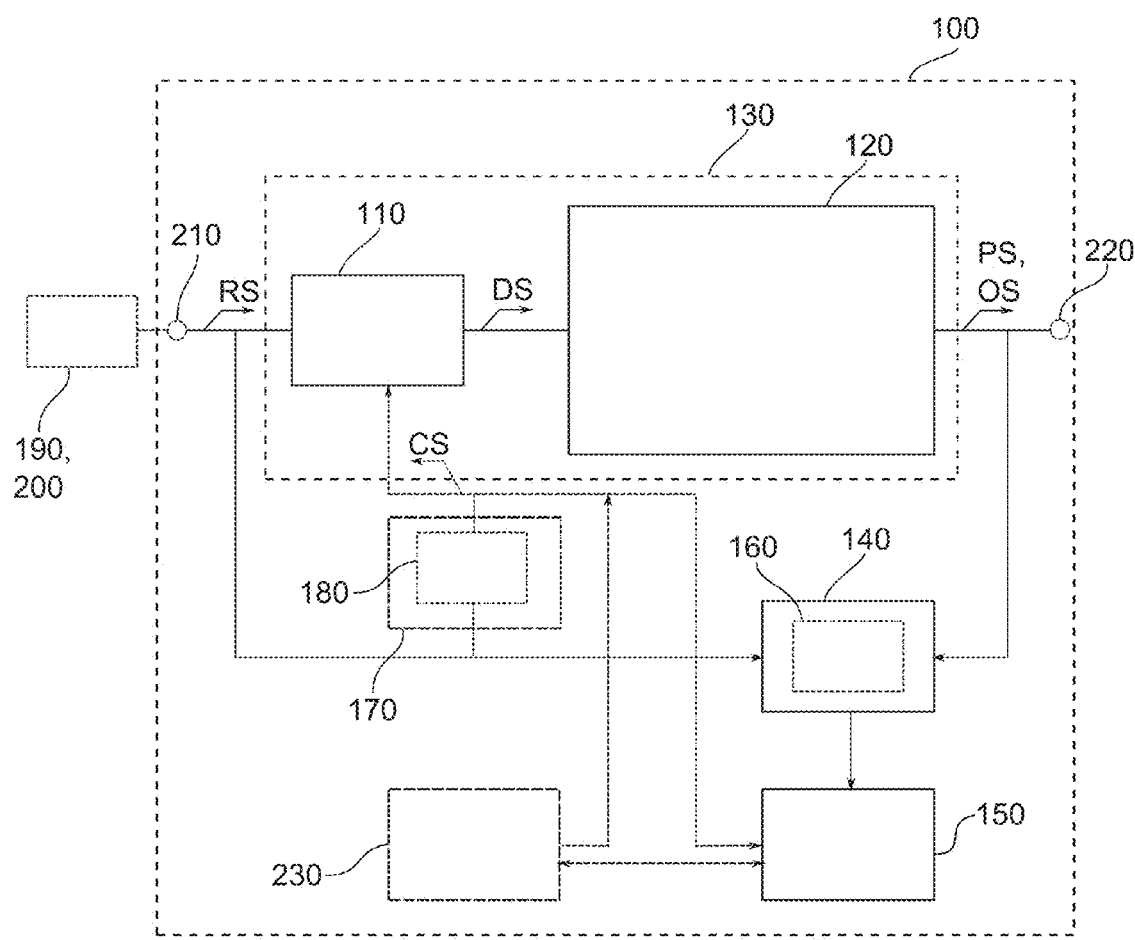
FIG. 2 shows a simplified block diagram of a circuit according to a further example.

FIG. 2 shows a simplified block diagram of a further example of a circuit 100, which differs from the one shown in FIG. 1 mainly with respect to the series connection 130. To be more precise, in the example shown in FIG. 2, the order along the signal flow direction from the terminal 210 to the output terminal 220 is reversed in terms of the location of the digital-to-time converter 110 and the signal processing circuit 120. As a consequence, the delayed signal DS is now provided as an input signal to the signal processing circuit 120, while the reference signal RS is provided to an input of the digital-to-time converter 110. Accordingly, the processed signal PS provided by the signal processing circuit 120 now becomes the output signal OS.

Figure 3:
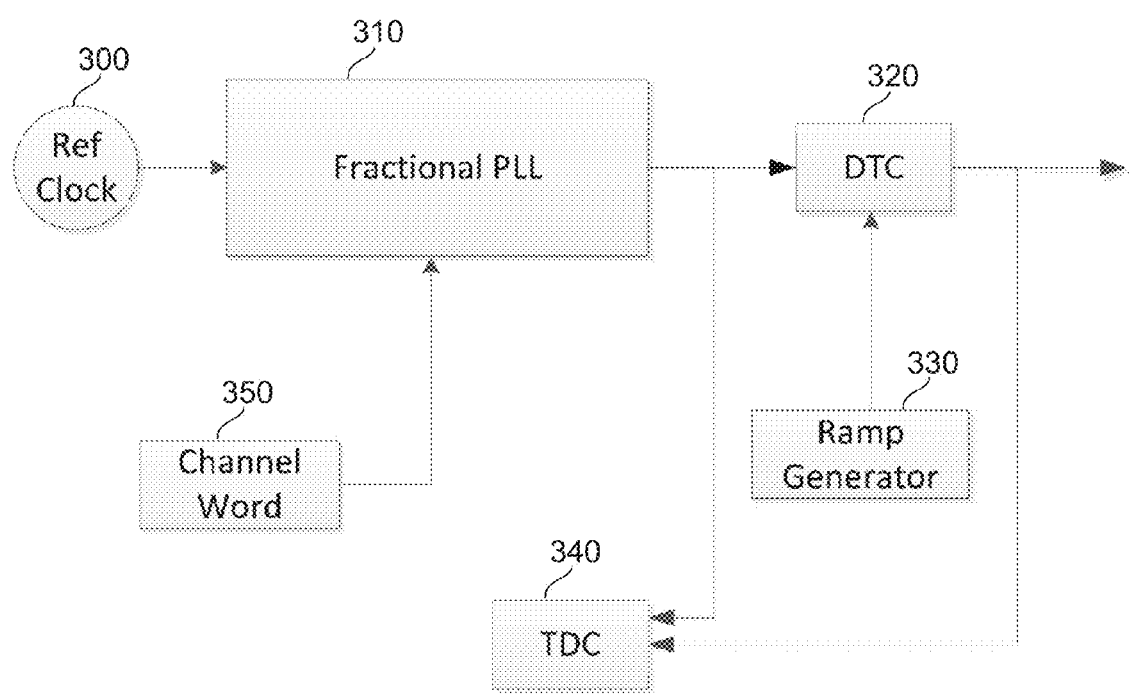
FIG. 3 shows a block diagram of a more conventional approach for a calibration of a digital-to-time converter.

FIG. 3 shows a block diagram of a more conventional approach for a digital-to-time converter (DTC) calibration set-up. The set-up shown in FIG. 3 comprises a reference clock signal generator 300 which is coupled to a fractional PLL circuit 310. The fractional PLL circuit 310 is coupled to a digital-to-time converter 320, which works once again as a controllable delay circuit generating the output signal of the set-up shown in FIG. 3. The set-up further comprises a ramp generator 330, which is coupled to the digital-to-time converter 320 in such a way to control the delay generated by the DTC 320. To be more precise, the DTC 320 may, for instance, generate a copy of the signal provided to its input in a delayed form, wherein the delay is adjustable or changeable based on the control signal provided by the ramp generator 330 in the set-up shown in FIG. 3.

Both, an input and an output of the DTC 320 are coupled to a time-to-digital converter (TDC) 340, which is capable of determining the delay between the input and the output of the signals provided to and generated by the DTC 320, respectively.

The fractional PLL circuit 310 is controlled by providing a corresponding channel word 350 to the fractional PLL circuit 310. The channel word 350 may, for instance, correspond to a frequency word indicative of the frequency to be generated by the fractional PLL circuit 310 based on the reference clock signal provided by the reference clock signal generator 300. In the case of a fractional PLL circuit 310 as depicted in FIG. 3, the channel word may, for instance, comprise an integer part and a fractional part as outlined before.

By implementing the set-up as depicted in FIG. 3, it may be possible to calibrate the digital-to-time converter 320. In this possible solution, the DTC non-linearity is measured by measuring or determining the time difference between the DTC input and outputs. However, although this implementation may allow a direct determination of the non-linearity of the DTC 320, it may also make it at least advisable, if not necessary, to implement the time-to-digital converter 340 with a detection range of at least one period of the output signal to measure the time difference. The output signal may once again be used as a local oscillator signal (LO signal).

However, in this case, the time-to-digital converter 340 may have to be implemented to be linear over the full range of its possible values. Otherwise, measurement errors may limit the achievable pre-distortion quality and, hence, the calibration quality of the digital-to-time converter 320. The calibration of the time-to-digital converter 340 may be used to correct the measured calibration data values. However, since this may have to be done for a wide range of delay values, calibrating the TDC 340 may be more costly or elaborate. Employing an example of a circuit 100 or other examples as will be laid out in more detail below, may help to relax the TDC linearity or calibration requirements to calibrate the digital-to-time converter 110.

Using an example as, for instance, shown in FIGS. 1 and 2, may allow to measure the time difference between the DTC output signal in the case of the implementation shown in FIG. 1 or of the signal processing circuit 120 in the case of the implementation shown in FIG. 2, respectively, and the reference clock signal RS of the signal processing circuit 120, which may naturally be implemented as a PLL. The PLL or in more general terms the signal processing circuit 120 may be used as the input source for the digital-to-time converter 110.

In principle, under ideal circumstances, if the digital-to-time converter phase shift is exactly the negative phase shift of the phase shift of the signal processing circuit 120 compared to the lower next multiple of the reference frequency, then, given a linear DTC 110 and a linear measurement circuit 140 or TDC 160, the DTC output and the reference clock edge may coincide perfectly. Thus, on average, any measured time difference comes from the DTC non-linearity.

Figure 4:
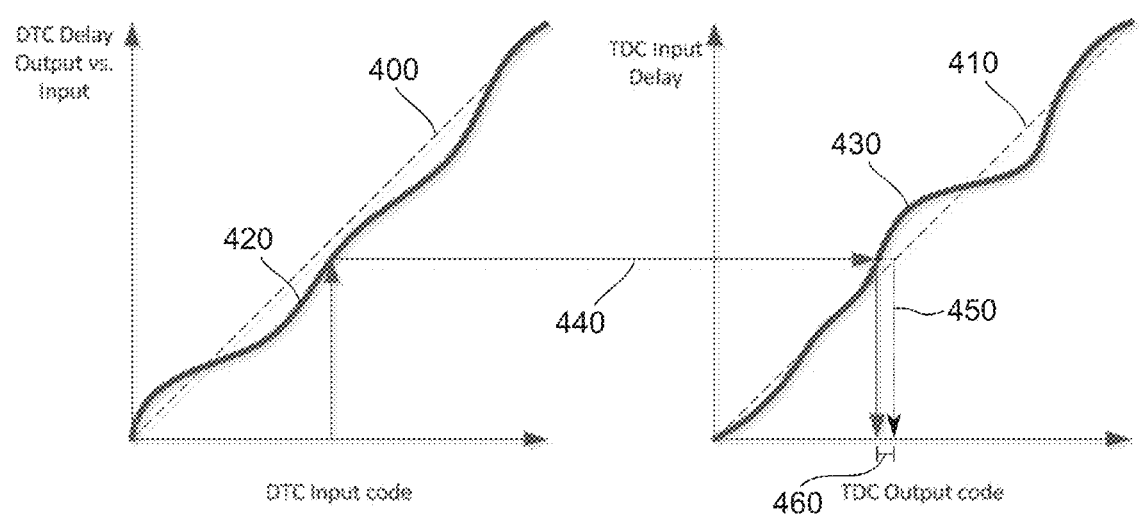
FIG. 4 shows two diagrams illustrating the non-linearity of the digital-to-time converter and the time-to-digital converter of the conventional calibration set-up shown in FIG. 3.

To illustrate this in more detail, FIG. 4 shows two diagrams next to one another indicating the DTC delay output-characteristics as a function of the DTC input code on the left side of FIG. 4 and the TDC input delay characteristics as a function of the TDC output code. Both diagrams each comprise an ideal linear characteristic 400, 410, respectively, which are shown in the left and right diagrams as a dashed line. However, due to imperfections and other device-related as well as environment-related influences, the actual characteristics 420, 430 show a more complex, non-linear behavior, which only approximates the ideal linear characteristics 400, 410, respectively.

In FIG. 4 a situation of a measurement is illustrated by three arrows 440 which illustrate a single calibration process. Starting with a DTC input code comprised, for instance, in the control signal generated by the ramp generator 330, the DTC 320 will delay the output signal compared to its input signal as indicated by the characteristics 420. This delay is provided to the TDC 340 as its input delay, which is then transformed by the TDC 340 into a corresponding TDC output code, which may then be saved in a memory not shown in FIG. 3.

The calibration of measurement procedure as illustrated by the arrows 440 leads, however, to a slightly too small TDC output code due to a large non-linearity of the TDC 340. To illustrate this, based on the DTC input code and the characteristics 420 of the DTC 320, FIG. 4 also indicates through arrow 450 the TDC output code the TDC 340 should have provided based on its ideal linear characteristic 410. The difference 460 as indicted on the abscissas of the right diagram corresponds to an error due to employing the calibration set-up depicted in FIG. 3.

The right diagram of FIG. 4 illustrates as to why employing the example as shown in FIGS. 1 and 2 may improve the calibration quality to compensate for nonlinearities of the DTC 100 as shown in FIGS. 1 and 2. Due to the fact that the signal processing circuit 120 and the DTC 110 essentially counteract each other's effect, the delays to be measured by the measurement circuit 140 or its time-to-digital converter 160 may be significantly smaller as discussed earlier. The measured delay may be comparable or, in some cases, may be even essentially the same for every measurement. Hence, the TDC 160 (measurement circuit 140) may operate in a very narrow range of values only. Thus, the nonlinearity outside that range may eventually be of lesser importance or even of no importance in terms of contributing to measurement errors. However, it does not matter where the exact operating point is. It could also be at greater input delays. As a consequence, a higher accuracy may be achievable in terms of the determined delay and also the calibration data may be more accurate.

To put it in other words, it may be possible to use a very narrow time-to-digital converter 160 or other measurement circuit 140 since it merely captures the non-linearity, but not the absolute phase shift of the output signal OS or the signal generated by the digital-to-time converter 110. This may help to relax the design and calibration parameters of the measurement circuit 140 or its time-to-digital converter 160.

Figure 5:
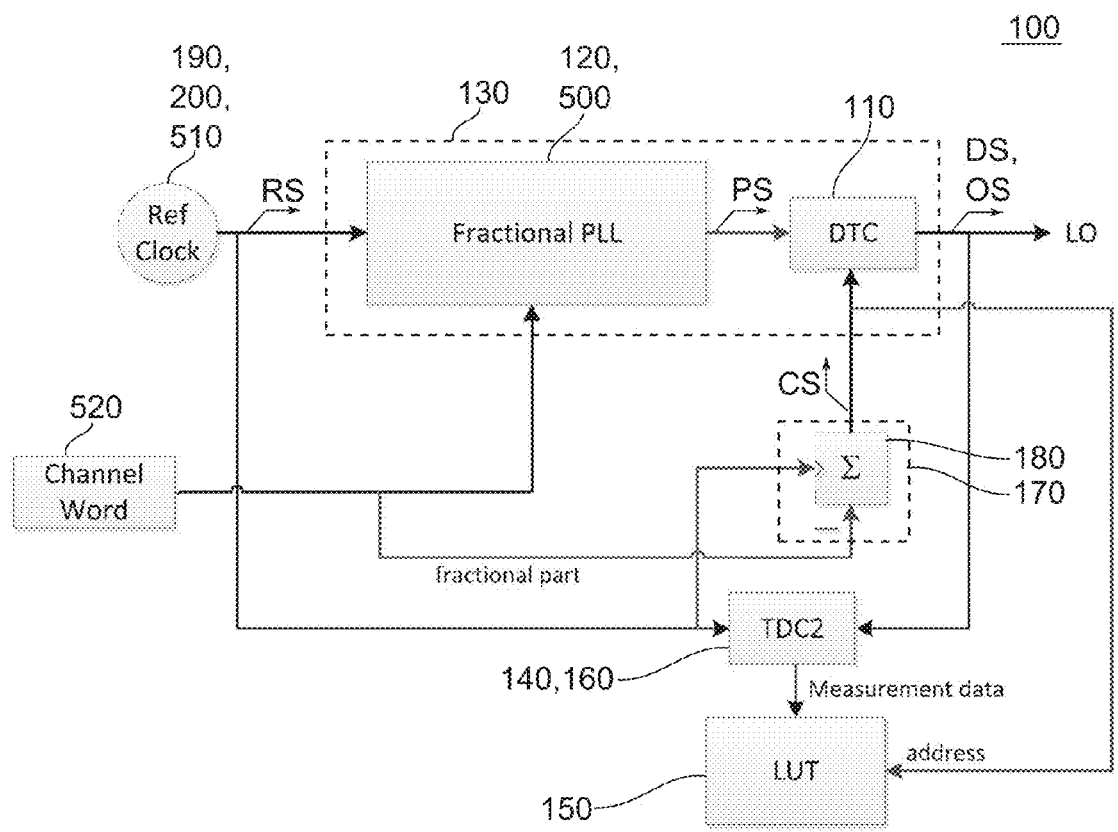
FIG. 5 shows a simplified block diagram of a circuit according to an example.

FIG. 5 shows a simplified block diagram of a further example of a circuit 100. The circuit 100 once again comprises a series connection 130 comprising a digital-to-time converter 110 and a signal processing circuit 120, which is implemented here as a fractional PLL circuit 500. A reference clock generator 510, which may, for instance, be based on a crystal oscillator 190 or a temperature-stabilized crystal oscillator 200. As already shown in FIG. 1, the reference clock generator 510 generates the reference signal RS, which is then provided to the fractional PLL circuit, which in turn generates the processed signal PS. The processed signal PS is then provided to the digital-to-time converter 110, which generates the delayed signal DS or output signal OS, which may, for instance, be used as a local oscillator signal LO. Once again, a channel word 520, which may, for instance comprise an integer part and a fractional part to control the fractional PLL circuit 500 and, hence, may be considered as a frequency word indicative of the frequency of the processed signal, is coupled to the fractional PLL circuit 500.

The fractional part of the channel word is provided to the generator circuit 170 and its integrator or accumulator 180. The fractional part of the channel word may be optionally multiplied by (−1) and provided to the integrator or accumulator 180 comprised in the generator circuit 170. Depending on the implementation specifics, it may be advisable to implement the factor of (−1) or to skip this factor, depending, for instance, on the question as the whether the (intended) time delay provided to the DTC 110 is to be considered a positive or a negative phase shift.

As indicated earlier, the integrator or accumulator 180 is clocked using the reference signal RS. An output of the integrator or accumulator 180 representing the control signal CS is set to the digital-to-time converter 110 to control the delay caused by the digital-to-time converter 110.

Alternatively, the integrator or accumulator 180 may also be clocked based on the output signal OS of the circuit 100. For instance, the integrator or accumulator 180 may be provided with the control signal CS being indicative of or comprising information on the fractional part of the channel word divided by the whole channel word. For instance, the generator circuit 170 may be capable of or configured to receiving the channel word and to provide the digital-to-time converter 110 with the respective control signal CS. This may allow at least partially correcting the phase shift of the signal processing circuit 120 more often, for instance, for each edge of the output signal OS, instead, for instance, for each edge of the reference signal only.

The circuit further comprises a measurement circuit 140, which is implemented here as a time-to-digital converter 160. The time-to-digital converter 160 is coupled to both an output of the digital-to-time converter 110 or rather an output of the circuit 100, at which the output signal OS is obtainable, and an input of the circuit 100, at which the reference signal RS is present during operation. An output of the time-to-digital converter is coupled to a memory 150, where the measurement data provided by the time-to-digital converter 160 are stored as the calibration data depending on the phase signal or rather the value of the control signal CS indicating the address of the look-up-table stored in the memory 150.

In FIG. 5 the time-to-digital converter 160 of the measurement circuit 140 is referred to as TDC2, since the fractional PLL circuit 500 may, for instance, comprise another time-to-digital converter 160 (TDC) as, for instance, the phase detector of the fractional PLL circuit. In other words, the time-to-digital converter 160 may represent an additional time-to-digital converter 160 implemented in the circuit.

In this context, it should be noted that as an alternative to a time-to-digital converter 160 any other circuit being capable of determining a phase difference or a time difference may be implemented as a measurement circuit 140. For instance, the measurement circuit 140 may comprise one or more divider or a multimode divider along with a more conventional phase detector, for instance, based on a shift register implementation to name just one further example.

The block diagram of the circuit 100 shown in FIG. 5 is capable of measuring the time difference between the digital-to-time converter output and the reference clock generator 510. Based on this time difference, the digital-to-time converter 110 may be calibrated as illustrated in FIG. 5. In this implementation, the PLL channel word 520, which is also referred to as channel word N, essentially represents the DTC input frequency divided by the reference frequency.

$$N = I + p/q = f_{DCO}/f_{REF} \qquad (1)$$

In Equation (1), I is the integer part, while p/q is the fractional part, as outlined before. $f_{DCO}$ is the frequency of the output signal OS and $f_{REF}$ is the frequency of the reference signal RS.

Since the output of the digital-to-time converter 110 is to be compared with the reference clock using the time-to-digital converter 160, a DTC output frequency $f_{DCO}$ is an integer multiple of the reference frequency $f_{REF}$ (=1/$T_{REF}$) with $T_{REF}$ being the cycle period of the reference signal RS. The normalized phase shift of the DCO output in one reference period TREF is the integral of the frequency according to Equation (2).

$$\int_0^{T_{REF}} f_{DCO} \, dt = \frac{f_{DCO}}{f_{REF}} = I + \frac{p}{q} \qquad (2)$$

As a consequence, the digital-to-time converter 110 needs each cycle to revert a phase shift of p/q of a full period (2π·p/q). Therefore, by applying the integral of the negative fractional part of the channel word to the digital-to-time converter 110 as implemented by the generator circuit 170, and its integrator or accumulator 180, this phase shift is exactly obtained. In the end, the measurement circuit 140 or rather its time-to-digital converter 160 sees a constant phase error plus a shift due to the non-linearity of the digital-to-time converter 110.

Considering also noise, employing a circuit 100 according to an example differs from the more conventional approach as discussed earlier, comprising a direct comparison of the DTC input and output. Using a circuit 100 according to an example, the measurement circuit 140 or rather its time-to-digital converter 160 is exposed to the full PLL noise of the fractional PLL circuit 500 as the measurement circuit 140 merely compares the output of the digital-to-time converter 110 to the reference clock generator 510 and its reference signal RS. However, since the noise is uncorrelated to the non-linearity of the digital-to-time converter 110, it may be attenuated by averaging over many measurements. In the memory 150, a calibration table can be built up accordingly. The measured results as provided by the measurement circuit 140 can be stored in a look-up-table (LUT), using the DTC input as the address where to store the actual value obtained by the measurement circuit 140.

In contrast to the more conventional procedure described before, the TDC linearity in this method is less critical because the time-to-digital converter 160 only captures the non-linearity, but not the linear part. Naturally, it may be advisable to assure that averaging converges to the actual TDC input delay. As a consequence, it may be advisable to implement a procedure to linearize the TDC, for instance, using an interpolation scheme. However, since it is a small range, the characterization may be easier compared to a full period range of the output signal or local oscillator signal in terms of the time-to-digital converter 160.

However, although in FIG. 5 a fractional PLL circuit has been shown, in principle, any kind of signal processing circuit 120 may be used. Any other kind of, for instance, radio-frequency clock generator can be used instead of an integer of the fractional PLL circuit. Examples include, for instance, the previously-mentioned direct digital synthesizer circuits (DDS circuits) as well as frequency multiplier circuits.

Figure 6:
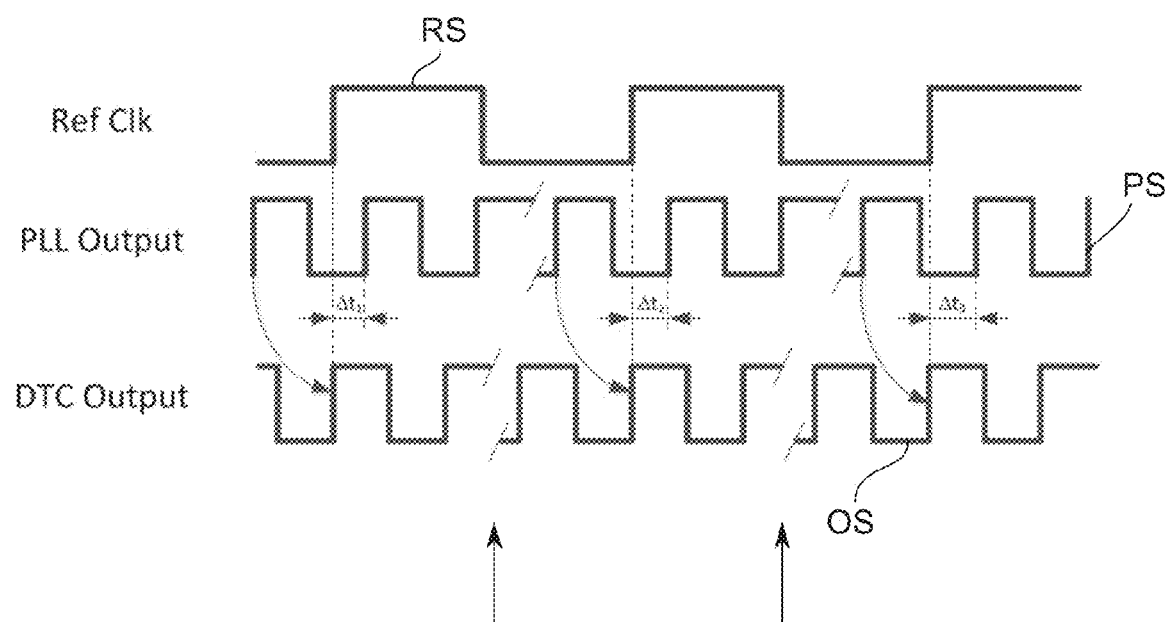
FIG. 6 shows a timing diagram comprising the reference signal, a PLL output signal and a DTC output signal.

FIG. 6 shows a timing diagram indicating the reference signal RS (Ref Clk), the processed signal PS, which represents the output signal of the PLL (PLL output), and the output signal, which is provided or generated by the digital-to-time converter 110 (DTC output). As indicated by the arrows, FIG. 6 shows along its abscissas indicative of the time, three different situations, at which the processed signal PS comprises a different delay with respect to the reference signal RS. However, due to the influence of the digital-to-time converter 110, the output signal OS is always in phase with the reference signal RS.

In other words, FIG. 6 illustrates how the delay of the PLL output signal PS with respect to the reference signal RS can be compensated due to the DTC delay being correctly adjusted. As a consequence, the rising flanks of the output signal OS corresponding to the DTC output signal are always in line with the edges of the reference signal RS.

Figure 7:
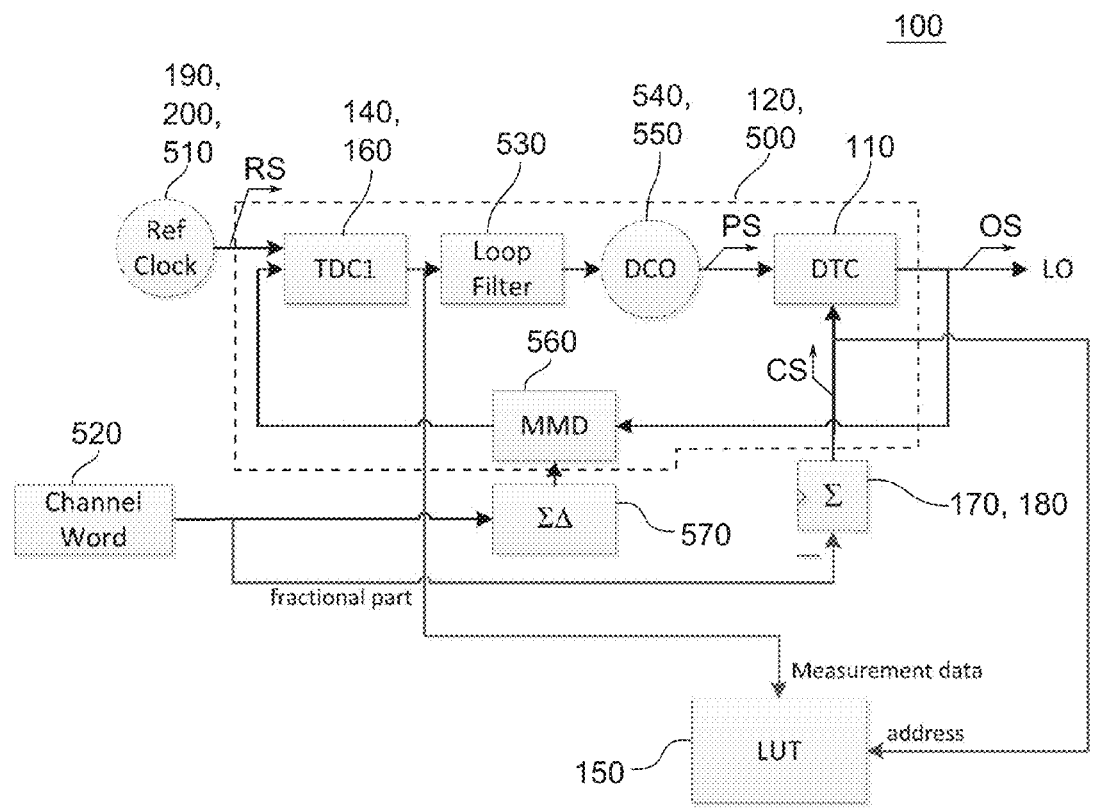
FIG. 7 shows a simplified block diagram of a further implementation of a circuit according to an example.

FIG. 7 shows an alternative implementation based on a closed-loop configuration. The alternative solution as shown in FIG. 7 uses the time-to-digital converter 160 as the measurement circuit 140 of a fractional PLL circuit 500 to directly measure the phase difference between the output signal OS and the reference signal RS. The fractional PLL circuit 500 implements a digital wideband closed loop phase modulator.

In the closed-loop calibration scheme implemented by the circuit 100 as depicted in FIG. 7, the fractional PLL circuit 500 comprises a series connection of the measurement circuit 140 implemented as a time-to-digital converter 160, a loop filter 530 and a controllable oscillator 540, implemented as a digitally-controlled oscillator 550 along the signal flow as indicated by the arrows in FIG. 7. In other words, the loop filter 530 is coupled behind the time-to-digital converter 160 and the controllable oscillator 540 is coupled behind the loop filter 530. The output of the controllable oscillator 540 is then coupled to the input of the digital-to-time converter 110.

The output signal OS as generated and provided by the digital-to-time converter 110 is fed back via a multiple mode divider 560 (MMD) to a further input of the time-to-digital converter 160 closing the loop of the fractional PLL circuit 500. The multiple mode divider 560 may be capable of dividing the frequency of the output signal in response to a signal obtained from the sigma delta modulator 570 (ΣΔ). As an input, the sigma delta modulator 570 is provided with a channel word 520 comprising once again the integer part and the fractional part indicative of the frequency to be generated by the fractional PLL circuit 500. The sigma delta modulator 570 controls the multimode divider 560 in such a way that the channel word also comprising the fractional part is transformed into paths with modulated signal (PWM signal) having an average value corresponding to the value of the channel word or, in other words, corresponding to the value of the sum of the integer part and the fractional part. Hence, the sigma delta modulator 570 switches the multimode divider 560 between two or more divider modes of operation such that an average division ratio corresponds to a mean value of the channel word 520.

An output of the measurement circuit 140 is coupled to the memory 150 to save the measurement data corresponding to the delays measured by the measurement circuit 140 as the corresponding calibration data. This can once again be done by saving or storing the data in a look-up-table.

Alternatively, instead of implementing the optional sigma delta modulator 570, the multimode divider 560 may also be provided directly with the integer part. In this case, the integer part determines the divider mode of the multiple mode divider 560 closing the feedback loop of the fractional PLL circuit 500.

To control the digital-to-time converter 110 and to provide it with a corresponding control signal CS, a fractional part of the channel word is provided to the generator circuit 170 comprising once again an integrator or accumulator 180, which provides the control signal to the digital-to-time converter 110 and to the memory 150 representing the address to where the measurement data are stored in the look-up-table. Although not depicted in FIG. 7, the integrator or accumulator 180 is once again clocked by the reference signal RS. As discussed earlier with respect to FIG. 5, the integrator or accumulator 180 may also be clocked based on the output signal OS.

In other words, in the set-up shown in FIG. 7, the multimode divider 560 is programmed to an integer ratio and the digital-to-time converter 110 produces a ramp-like phase shift. The fractional PLL circuit 500 will settle to an output signal frequency or local oscillator frequency, which is an integer multiple of the reference signal RS (reference clock). However, the output frequency provided by the digitally-controlled oscillator 550 (DCO), which also serves as the input for the digital-to-time converter 110, also has a fractional part. Thus, the DTC input is excited over the full range.

One difference concerning this set-up is that the time-to-digital converter 160 needs to be able to lock the PLL circuit 500. However, during calibration only a narrow detection range is once again required.

The DTC noise within the PLL bandwidth may be attenuated using this approach. Naturally, other circuits 100 are by far not required to comprise a multimode divider 560 or another divider. In other words, a circuit 100 may also be implemented divider-less or based on a divider-less PLL circuit 500.

In the circuit 100 shown in FIG. 7, the measurement circuit 140 is part of the signal processing circuit 120. The output of the measurement circuit 140 is coupled to the controllable oscillator 540, which is configured to generate the processed signal based on the output of the measurement circuit 140. However, in the example shown in FIG. 7, the loop filter 530 is coupled between the output of the measurement circuit of the controllable oscillator 540, which is implemented as a digitally-controlled oscillator 550. As mentioned before, the digital-to-time converter 110 is coupled to an output of the controllable oscillator 540.

By using a circuit 100, a local oscillator comprising a digital-to-time converter 110 may become more attractive for applications comprising multimode radio-frequency signal processing. For instance, it may be possible to remove the need to implement several PLL circuits or digitally-controlled oscillators on a chip. By implementing a circuit 100 according to an example, it may be possible to save chip area, for instance, by a factor of 10 or more compared to implementing, for instance, DCO coils as used in more conventional receivers, transmitters or transceivers.

While in the examples discussed before the one shown in FIG. 7, the measurement circuit 140 was implemented as an additional circuit. For instance, the measurement circuit 140 could comprise an additional or second time-to-digital converter 160 as described before. However, as shown in FIG. 7, this is by far not necessary.

Figure 8:
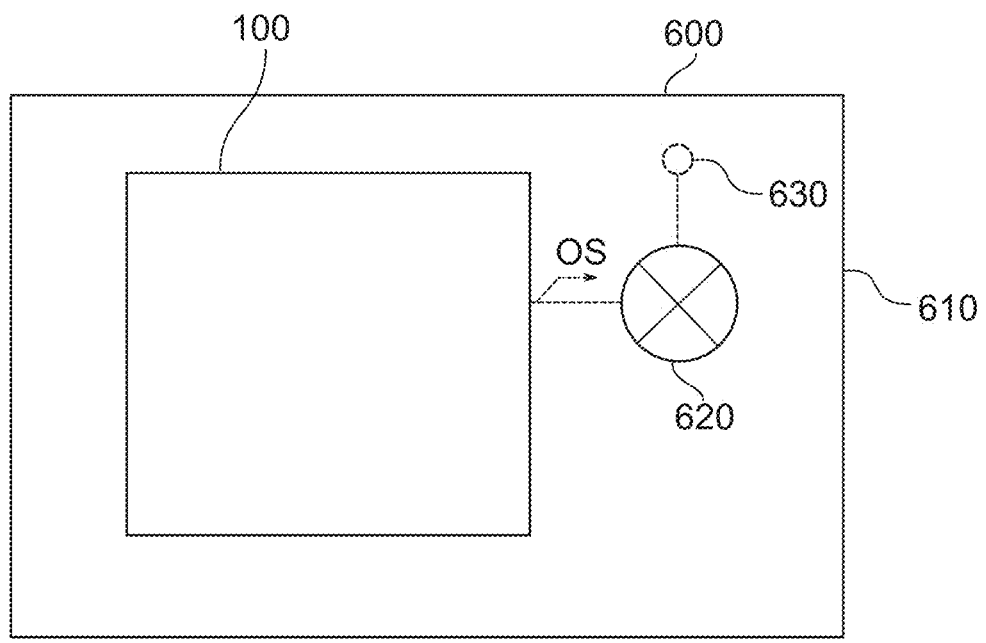
FIG. 8 shows a schematic diagram of an integrated circuit according to an example.

FIG. 8 shows an integrated circuit 600, which may, for instance, be implemented on a substrate 610. The substrate 610 may be a semiconducting substrate such as a die or the like made from a semiconducting material, for instance, silicon (Si), germanium-arsenide (GeAs) or other materials. The substrate may, however, also be a non-semiconducting substrate, for instance, an electrically insulating substrate made from an insulating material. Moreover, the substrate may also comprise one or more conducting and/or insulating layers, on top of which and/or in which circuits may be formed.

The substrate 610 may essentially be disc-like shaped extending along three linear independent directions. Along two of the linear independent directions, the substrate 610 extends significantly further compared to the third direction. For instance, the smallest extension along any of the first and second directions may be at least 10 times, at least 20 times or at least 50 times larger than the extension along the third direction. The main surface of the substrate 610 may be parallel to the first and second directions being significantly larger than the third direction.

The integrated circuit 600 comprises the circuit 100 according to an example as outlined before, which may, for instance, be fabricated using thin-film processes and other semiconductor-related fabrication processes. The integrated circuit 600 may optionally further comprise a mixer 620 coupled to the circuit to receive the output signal OS as a local oscillator signal. Optionally, the integrated circuit 600 may further comprise a terminal 630 configured to couple an antenna to the mixer circuit 620.

Figure 9:
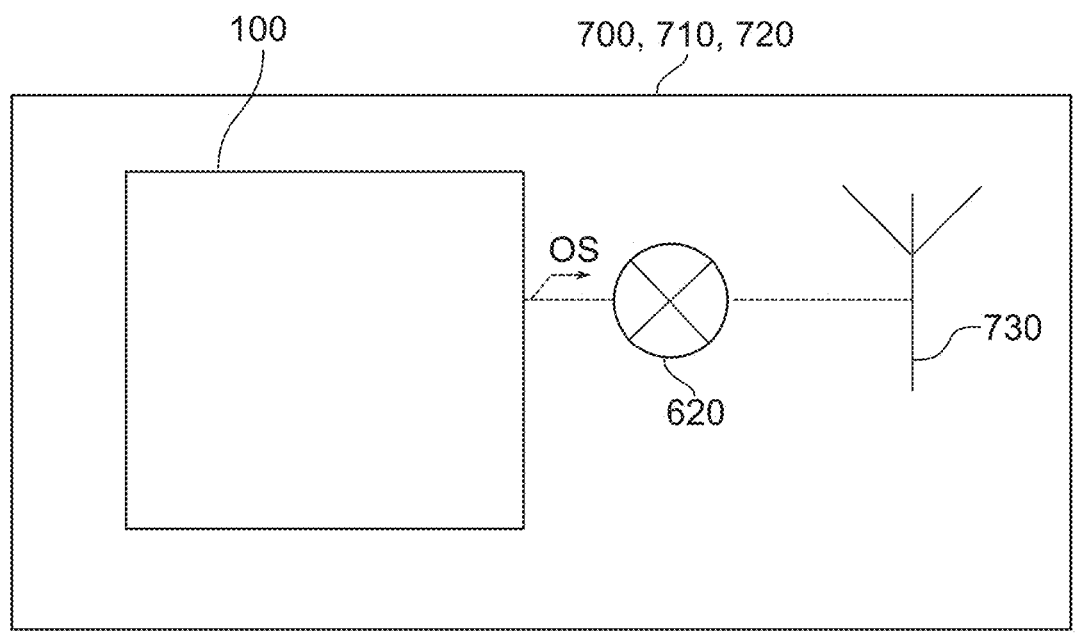
FIG. 9 shows a schematic block diagram of a transmitter, a receiver or a transceiver according to an example.

FIG. 9 shows a schematic block diagram of a transmitter 700, a receiver 710 or a transceiver 720. The transmitter 700, the receiver 710 or the transceiver 720 comprises a circuit 100 as described before. It may further comprise a mixer circuit 620 coupled to the circuit in such a way that it is capable of receiving the output signal OS of the circuit 100 as a local oscillator signal. It may further comprise an antenna 730 coupled to the mixer circuit. Naturally, the transmitter 700, the receiver 710 or the transceiver 720 may comprise further components to amplify, to process, to perform a signal shaping, noise reduction or other signal manipulations. These, however, have been omitted for the sake of clarity only.

Figure 10:
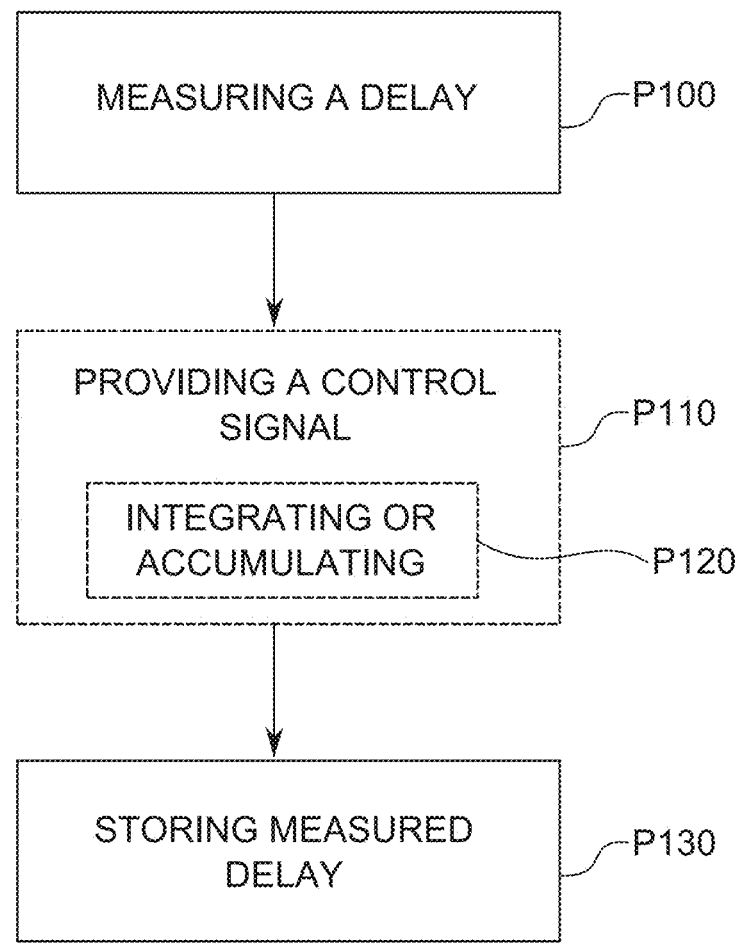
FIG. 10 shows a flowchart of a method for obtaining calibration data according to an example.

FIG. 10 shows a flowchart of a method for obtaining calibration data according to an example. A first process P100 comprises measuring a delay between a signal generated by a digital-to-time converter 110 of a circuit 100 at an output of the digital-to-time converter 110 and a reference signal RS. The circuit 100 is the circuit 100 as described before comprising, for instance, the digital-to-time converter 110 and a signal processing circuit 120 coupled to the digital-to-time converter 110 and configured to generate a processed signal PS derived from a signal provided to the signal processing circuit 120. The processed signal PS comprises a predetermined phase relation with respect to the signal provided to the signal processing circuit. The circuit 100 is further configured to receive the reference signal RS and to generate an output signal based on the received reference signal.

In an optional process P110, a control signal is provided to the digital-to-time converter 110 to counteract a change of the predetermined phase relation, wherein the signal processing circuit 120 is configured to change the predetermined phase relation. Providing the control signal in the process P110 may optionally comprise in a process P120 integrating or accumulating a signal comprising information concerning a fractional part as outlined and discussed before.

In a process P130, the measured delay is stored to a memory as calibration data of the digital-to-time converter 110.

Figure 11:
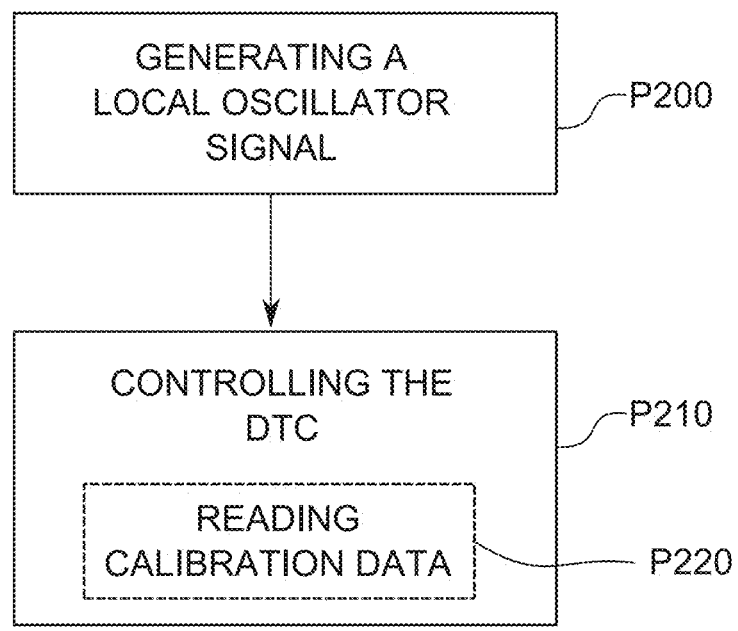
FIG. 11 shows a flowchart of a method for generating an output signal according to an example.

FIG. 11 finally shows a flowchart of a method for generating a local oscillator signal according to an example. The method comprises in a process P200 generating the local oscillator signal using a circuit comprising a digital-to-time converter 110 and a signal processing circuit 120 coupled to the digital-to-time converter 110 and configured to generate a processed signal PS derived from a signal provided to the signal processing circuit 120. The processed signal comprises a predetermined phase relation with respect to the signal provided to the signal processing circuit 120. The circuit 100 is configured to receive the reference signal RS and to generate the output signal based on the received reference signal. In a process P210, the method further comprises controlling the digital-to-time converter during the generation of the local oscillator signal based on the calibration data stored in the memory of the circuit 100. The local oscillator signal may be the output signal OS of the circuit.

Optionally, in a process P220, controlling the digital-to-time converter 110 comprises reading calibration data from the memory 150.

In the following examples pertain to further examples.

Example 1 is a circuit comprising a digital-to-time converter, and a signal processing circuit coupled to the digital-to-time converter and configured to generate a processed signal derived from a signal provided to the signal processing circuit, the processed signal comprising a predetermined phase relation with respect to the signal provided to the signal processing circuit, wherein the circuit is configured to receive a reference signal and to generate an output signal based on the received reference signal. The a measurement circuit is configured to measure a delay between the output signal and the received reference signal, wherein the output of the digital-to-time converter is coupled to a memory configured to store calibration data of the digital-to-time converter based on the measured delay.

In example 2, the subject matter of example 1 may optionally include the digital-to-time converter and the signal processing circuit being coupled in series forming a series connection, wherein the reference signal is provided to an input of the series connection and the output signal is obtainable at an output of the series connection.

In example 3, the subject matter of any of the preceding examples may optionally include the reference signal being provided to the signal processing circuit, wherein the output signal is obtainable from the digital-to-time converter.

In example 4, the subject matter of any of the preceding examples may optionally include the signal processing circuit being configured to change the predetermined phase relation, wherein the circuit comprises a generator circuit configured to provide a control signal to the digital-to-time converter to counteract the change of the predetermined phase relation.

In example 5, the subject matter of example 4 may optionally include the generator circuit comprising an integrator or an accumulator coupled to the digital-to-time converter to provide the control signal.

In example 6, the subject matter of example 5 may optionally include the integrator or the accumulator being clocked by the reference signal, a signal derived from the reference signal comprising the substantially the same frequency as the reference signal or based on the output signal.

In example 7, the subject matter of any of the preceding examples may optionally include the memory being configured to store the calibration data based on a control signal provided to the memory.

In example 8, the subject matter of any of the preceding examples may optionally include the memory being configured to store a look-up-table comprising the calibration data of the digital-to-time converter.

In example 9, the subject matter of any of the preceding examples may optionally include the signal processing circuit being configured to process an oscillating signal provided to the signal processing circuit and to generate the processed signal as an oscillating signal.

In example 10, the subject matter of any of the preceding examples may optionally include a ratio of the frequency of the processed signal with respect to a frequency of the signal provided to the signal processing circuit or inverse of the ratio being larger than one (1) and equal to a sum of an integer part and a non-vanishing fractional part, wherein an absolute value of the fractional part is smaller than one (1). For instance, the signal processing circuit may be configured or adapted accordingly.

In example 11, the subject matter of example 10 may optionally include the ratio or the inverse of the ratio being equal to (I+p/q), wherein I is an integer, wherein p and q are a non-vanishing integers, and wherein an absolute value of p is smaller than an absolute value of q.

In example 12, the subject matter of any of the preceding examples may optionally include the signal processing circuit being configured to change the predetermined phase relation, wherein the circuit comprises a generator circuit configured to provide a control signal to the digital-to-time converter to counteract the change of the predetermined phase relation, the generator circuit comprising an integrator or an accumulator coupled to the digital-to-time converter to provide the control signal, wherein the integrator or accumulator is configured to process a signal comprising information concerning the fractional part.

In example 13, the subject matter of any of the preceding examples may optionally include the signal processing circuit comprising at least partially at least one of an integer phase-locked-loop circuit, a fractional phase-locked-loop circuit, a direct digital synthesizer circuit, and a frequency multiplier circuit.

In example 14, the subject matter of any of the preceding examples may optionally include the measurement circuit which is configured to detect more than three different delay values between the output signal and the reference signal.

In example 15, the subject matter of any of the preceding examples may optionally include the measurement circuit being part of the signal processing circuit.

In example 16, the subject matter of example 15 may optionally include an output of the measurement circuit being coupled to a controllable oscillator configured to generate the processed signal based on the output of the measurement circuit.

In example 17, the subject matter of example 16 may optionally include a loop filter being coupled between the output of the measurement circuit and the controllable oscillator.

In example 18, the subject matter of any of the examples 16 or 17 may optionally include the controllable oscillator being a digitally controlled oscillator.

In example 19, the subject matter of any of the example 16 to 18 may optionally include the digital-to-time converter being coupled to an output of the controllable oscillator.

In example 20, the subject matter of any of the examples 1 to 14 may optionally include the signal processing circuit being configured to be operable independent of a signal provided by the measurement circuit.

In example 21, the subject matter of any of the preceding examples may optionally include the measurement circuit comprising a time-to-digital converter.

In example 22, the subject matter of any of the preceding examples may optionally include the digital-to-time converter being configured to delay a signal provided to an input of the digital-to-time converter by a controllable delay and to generate the delayed signal at an output of the digital-to-time converter.

In example 23, the subject matter of any of the preceding examples may optionally include the circuit being configured to generate the output signal as a radio-frequency signal.

In example 24, the subject matter of any of the preceding examples may optionally include a terminal to provide the reference signal to the circuit.

In example 25, the subject matter of any of the preceding examples may optionally include the circuit being configured to receive the reference signal from a temperature stabilized crystal oscillator.

In example 26, the subject matter of any of the preceding examples may optionally include the circuit being configured to generate a local oscillator signal as the output signal, and wherein the circuit is configured to control the digital-to-time converter during the generation of the local oscillator signal based on the calibration data stored in the memory.

Example 27 is an integrated circuit comprising a circuit, wherein the circuit comprises a digital-to-time converter, and a signal processing circuit coupled to the digital-to-time converter and configured to generate a processed signal derived from a signal provided to the signal processing circuit, the processed signal comprising a predetermined phase relation with respect to the signal provided to the signal processing circuit, wherein the circuit is configured to receive a reference signal and to generate an output signal based on the received reference signal, wherein the a measurement circuit is configured to measure a delay between the output signal and the received reference signal, and wherein the output of the digital-to-time converter is coupled to a memory configured to store calibration data of the digital-to-time converter based on the measured delay.

In example 28, the subject matter of example 27 may optionally further include a mixer circuit coupled to the circuit to receive the output signal of the circuit as a local oscillator signal.

In example 29, the subject matter of example 28 may optionally include the integrated circuit comprising a terminal configured to couple an antenna to the mixer circuit.

In example 30, the subject matter of any of the examples 28 or 29 may optionally include the integrated circuit being configured to control the digital-to-time converter during the generation of the local oscillator signal based on the calibration data stored in the memory.

Example 31 is a transmitter, a receiver or a transceiver comprising a circuit, the circuit comprising a digital-to-time converter, and a signal processing circuit coupled to the digital-to-time converter and configured to generate a processed signal derived from a signal provided to the signal processing circuit, the processed signal comprising a predetermined phase relation with respect to the signal provided to the signal processing circuit, wherein the circuit is configured to receive a reference signal and to generate an output signal based on the received reference signal. A measurement circuit is configured to measure a delay between the output signal and the received reference signal, wherein the output of the digital-to-time converter is coupled to a memory configured to store calibration data of the digital-to-time converter based on the measured delay.

In example 32, the subject matter of example 31 may optionally further include a mixer circuit coupled to the circuit to receive the output signal of the circuit as a local oscillator signal.

In example 33, the subject matter of example 32 may optionally include an antenna coupled to the mixer circuit.

In example 34, the subject matter of any of the example 32 or 33 may optionally include the integrated circuit being configured to control the digital-to-time converter during the generation of the local oscillator signal based on the calibration data stored in the memory.

Example 35 is a method for obtaining calibration data, the method comprising measuring a delay between an output signal of a circuit and a reference signal, the circuit comprising the digital-to-time converter and a signal processing circuit coupled to the digital-to-time converter and configured to generate a processed signal derived from a signal provided to the signal processing circuit, the processed signal comprising a predetermined phase relation with respect to the signal provided to the signal processing circuit, wherein the circuit is configured to receive the reference signal and to generate the output signal based on the received reference signal, and storing calibration data of the digital-to-time converter based on the measured delay to a memory.

In example 36, the subject matter of example 35 may optionally include the signal processing circuit being configured to change the predetermined phase relation, the method further comprising providing a control signal to the digital-to-time converter to counteract the change of the predetermined phase relation.

In example 37, the subject matter of example 36 may optionally include storing the calibration data comprising storing the calibration date based on the control signal.

In example 38, the subject matter of any of the examples 36 or 37 may optionally include storing the calibration data comprising storing the calibration data in the form of a look-up-table.

In example 39, the subject matter of any of the examples 36 to 38 may optionally include a ratio of the frequency of the processed signal with respect to a frequency of the signal provided to the signal processing circuit or an inverse of the ratio being larger than one (1) and equal to a sum of an integer part and a non-vanishing fractional part, wherein an absolute value of the fractional part is smaller than one (1). For instance, the signal processing circuit may be configured accordingly.

In example 40, the subject matter of example 39 may optionally include the ratio or the inverse of the ratio is equal to (I+p/q), wherein I is an integer, wherein p and q are a non-vanishing integers, and wherein an absolute value of p is smaller than an absolute value of q.

In example 41, the subject matter of any of the examples 39 or 40 may optionally include providing the control signal to the digital-to-time converter comprising integrating or accumulating a signal comprising information concerning the fractional part.

In example 42, the subject matter of any of the examples 35 to 41 may optionally include measuring the delay comprising detecting more than three different delay values between the output signal and the reference signal.

In example 43, the subject matter of any of the examples 35 to 42 may optionally include the output signal being a radio-frequency signal.

In example 44, the subject matter of any of the examples 35 to 43 may optionally include the circuit being configured to receive the reference signal from a temperature stabilized crystal oscillator.

Example 45 is an apparatus for obtaining calibration data, the apparatus comprising a means for measuring a delay between an output signal and a reference signal, the circuit comprising the digital-to-time converter and a signal processing circuit coupled to the digital-to-time converter and configured to generate a processed signal derived from a signal provided to the signal processing circuit, the processed signal comprising a predetermined phase relation with respect to the signal provided to the signal processing circuit, wherein the circuit is configured to receive the reference signal and to generate the output signal based on the received reference signal, and a means for storing calibration data of the digital-to-time converter based on the measured delay.

In example 46, the subject matter of example 45 may optionally include the signal processing circuit being configured to change the predetermined phase relation, the method further comprising providing a control signal to the digital-to-time converter to counteract the change of the predetermined phase relation.

Example 47 is a machine readable storage medium including program code, when executed, to cause a machine to perform the method of any one of examples 35 to 44.

Example 48 is a machine readable storage including machine readable instructions, when executed, to implement a method or realize an apparatus as described in any pending example.

Example 49 is a computer program having a program code for performing any of the methods of examples 35 to 44, when the computer program is executed on a computer or processor.

Example 50 is a method for generating a local oscillator signal, the method comprising generating an output signal using a circuit comprising a digital-to-time converter and a signal processing circuit coupled to the digital-to-time converter and configured to generate a processed signal derived from a signal provided to the signal processing circuit, the processed signal comprising a predetermined phase relation with respect to the signal provided to the signal processing circuit, wherein the circuit is configured to receive the reference signal and to generate an output signal as the local oscillator signal based on the received reference signal, and controlling the digital-to-time converter during the generation of the local oscillator signal based on the calibration data stored in a memory.

In example 51, the subject matter of example 50 may optionally include controlling the digital-to-time converter comprising reading calibration data from the memory.

Example 52 is an apparatus for generating an output signal, the apparatus comprising a means for generating an output signal using a circuit comprising a digital-to-time converter and a signal processing circuit coupled to the digital-to-time converter and configured to generate a processed signal derived from a signal provided to the signal processing circuit, the processed signal comprising a predetermined phase relation with respect to the signal provided to the signal processing circuit, wherein the circuit is configured to receive the reference signal and to generate the output signal based on the received reference signal, and a means for controlling the digital-to-time converter during the generation of the local oscillator signal based on the calibration data stored in a memory.

In example 53, the subject matter of example 52 may optionally include the means for controlling the digital-to-time converter comprising a means for reading calibration data from the memory.

Example 54 is a machine readable storage medium including program code, when executed, to cause a machine to perform the method of any one of examples 50 or 51.

Example 55 is a machine readable storage including machine readable instructions, when executed, to implement a method or realize an apparatus as described in any pending example.

Example 56 is a computer program having a program code for performing any of the methods of examples 50 or 51, when the computer program is executed on a computer or processor.

Examples may, therefore, provide a computer program having a program code for performing one of the above methods, when the computer program is executed on a computer or processor. A person of skill in the art would readily recognize that steps of various above-described methods may be performed by programmed computers. Herein, some examples are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. The examples are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and examples of the disclosure, as well as specific examples thereof, are intended to encompass equivalents thereof.

Functional blocks denoted as "means for . . . " (performing a certain function) shall be understood as functional blocks comprising circuitry that is configured to perform a certain function, respectively. Hence, a "means for s.th." may as well be understood as a "means configured to or suited for s.th.". A means configured to perform a certain function does, hence, not imply that such means necessarily is performing the function (at a given time instant).

Functions of various elements shown in the figures, including any functional blocks labeled as "means", "means for providing a sensor signal", "means for generating a transmit signal.", etc., may be provided through the use of dedicated hardware, such as "a signal provider", "a signal processing unit", "a processor", "a controller", etc. as well as hardware capable of executing software in association with appropriate software. Moreover, any entity described herein as "means", may correspond to or be implemented as "one or more modules", "one or more devices", "one or more units", etc. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read only memory (ROM) for storing software, random access memory (RAM), and non-volatile storage. Other hardware, conventional and/or custom, may also be included.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate example. While each claim may stand on its own as a separate example, it is to be noted that—although a dependent claim may refer in the claims to a specific combination with one or more other claims—other examples may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons. Furthermore, in some examples a single act may include or may be broken into multiple sub acts. Such sub-acts or sub-processes may be included and be part of such a single act or process, unless explicitly excluded.

The invention claimed is:

1. A circuit comprising:
   a digital-to-time converter; and
   a signal processing circuit coupled to the digital-to-time converter and configured to generate a processed signal derived from a signal provided to the signal processing circuit, the processed signal comprising a predetermined phase relation with respect to the signal provided to the signal processing circuit,
   wherein the circuit is configured to receive a reference signal and to generate an output signal based on the received reference signal;
   a measurement circuit configured to measure a delay between the output signal and the received reference signal and store, in a memory, digital-to-time converter calibration data derived from the delay,
   wherein the signal processing circuit is configured to operate independent of a signal provided by the measurement circuit.

2. The circuit according to claim 1, wherein the digital-to-time converter and the signal processing circuit are coupled in series forming a series connection, wherein the reference signal is provided to an input of the series connection and the output signal is obtained at an output of the series connection.

3. The circuit according to claim 1, wherein the reference signal is provided to the signal processing circuit, and wherein the output signal is obtained from the digital-to-time converter.

4. The circuit according to claim 1, wherein the signal processing circuit is configured to change the predetermined phase relation, and wherein the circuit comprises a generator circuit configured to provide a control signal to the digital-to-time converter to counteract the change of the predetermined phase relation.

5. The circuit according to claim 4, wherein the generator circuit comprises an integrator or an accumulator coupled to the digital-to-time converter to provide the control signal.

6. The circuit according to claim 5, wherein the integrator or the accumulator is clocked by the reference signal, a signal derived from the reference signal comprising the same frequency as the reference signal or based on the output signal.

7. The circuit according to claim 1, wherein the memory is configured to store the calibration data based on a control signal provided to the memory.

8. The circuit according to claim 1, wherein the memory is configured to store a look-up-table comprising the calibration data.

9. The circuit according to claim 1, wherein the signal processing circuit is configured to process an oscillating signal provided to the signal processing circuit and to generate the processed signal as an oscillating signal.

10. The circuit according to claim 1, wherein a ratio of the frequency of the processed signal with respect to a frequency of the signal provided to the signal processing circuit or an inverse of the ratio is larger than one and equal to a sum of an integer part and a non-vanishing fractional part, wherein an absolute value of the fractional part is smaller than one.

11. The circuit according to claim 1, wherein the signal processing circuit is configured to change the predetermined phase relation, wherein the circuit comprises a generator circuit configured to provide a control signal to the digital-to-time converter to counteract the change of the predetermined phase relation, the generator circuit comprising an integrator or an accumulator coupled to the digital-to-time converter to provide the control signal, wherein the integrator or accumulator is configured to process a signal comprising information concerning a fractional part of a desired frequency of the output signal based on a frequency of the reference.

12. The circuit according to claim 1, wherein the signal processing circuit comprises at least one of an integer phase-locked-loop circuit, a fractional phase-locked-loop circuit, a direct digital synthesizer circuit, and a frequency multiplier circuit.

13. The circuit according to claim 1, wherein the measurement circuit is configured to detect more than three different delay values between the output signal and the reference signal.

14. The circuit according to claim 1, wherein the measurement circuit is part of the signal processing circuit.

15. The circuit according to claim 14, wherein an output of the measurement circuit is coupled to a controllable oscillator configured to generate the processed signal based on the output of the measurement circuit.

16. The circuit according to claim 1, wherein the measurement circuit comprises a time-to-digital converter.

17. The circuit according to claim 1, comprising a control circuit configured to access the memory and generate a control signal for the digital-to-time converter based on the calibration data stored in the memory.

18. The circuit according to claim 17, wherein the control signal communicates to the digital-to-time converter an amount of delay to add to the processed signal to align a phase of the processed signal with the reference signal prior to the processed signal becoming the output signal and further wherein the control circuit is configured to:
    access the memory and identify calibration data addressed by a present control signal;
    adapt the present control signal based on the calibration data; and
    provide a resulting adapted control signal to the digital-to-time converter.

19. An integrated circuit comprising a circuit, the circuit comprising
    a digital-to-time converter, and
    a signal processing circuit coupled to the digital-to-time converter and configured to generate a processed signal derived from a signal provided to the signal processing circuit, the processed signal comprising a predetermined phase relation with respect to the signal provided to the signal processing circuit,
    wherein the circuit is configured to receive a reference signal and to generate an output signal based on the received reference signal;
    a measurement circuit configured to measure a delay between the output signal and the received reference signal and store, in a memory, digital-to-time converter calibration data derived from the delay,
    wherein the signal processing circuit is configured to operate independent of a signal provided by the measurement circuit.

20. The integrated circuit according to claim 19, further comprising a mixer circuit coupled to the circuit to receive the output signal of the circuit as a local oscillator signal.

21. A transmitter, a receiver or a transceiver comprising a circuit, the circuit comprising:
    a digital-to-time converter, and
    a signal processing circuit coupled to the digital-to-time converter and configured to generate a processed signal derived from a signal provided to the signal processing circuit, the processed signal comprising a predetermined phase relation with respect to the signal provided to the signal processing circuit,
    wherein the circuit is configured to receive a reference signal and to generate an output signal based on the received reference signal; and
    a measurement circuit configured to measure a delay between the output signal and the received reference signal and store, in a memory, digital-to-time converter calibration data derived from the delay,
    wherein the signal processing circuit is configured to operate independent of a signal provided by the measurement circuit.

* * * * *